US006300842B1

(12) United States Patent
Leiter et al.

(10) Patent No.: US 6,300,842 B1
(45) Date of Patent: Oct. 9, 2001

(54) ARRANGEMENT FOR PRODUCING ELECTRICAL OSCILLATIONS

(75) Inventors: Manfred Leiter, Stuttgart; Kurt Weiblen, Metzingen; Berhard Lucas, Besigheim; Frank Schatz, Kornwestheim; Thomas Beez, Weiinsberg; Juergen Seiz, Welzheim; Helmeut Baumann, Gomaringen; Herbert Olbrich, Rutesheim; Heinz Eisenschmid, Stuttgart; Eberhard Moess, Murrhardt; Joachim Dutzi, Weissach; Andreas Kugler, Alfdorf, all of (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/501,738

(22) Filed: Feb. 11, 2000

(30) Foreign Application Priority Data

Feb. 15, 1999 (DE) ................................. 199 06 205

(51) Int. Cl.⁷ ...................................................... H03B 7/14
(52) U.S. Cl. ......................... 331/107 G; 331/68; 331/96; 331/107 DP

(58) Field of Search ................................. 331/96, 107 DP, 331/107 G, 107 T, 117 D, 187, 68

(56) References Cited

U.S. PATENT DOCUMENTS 4,327,339 * 4/1982 Bert .................................. 331/107 P
4,502,023 * 2/1985 Heitzmann ....................... 331/107 R

FOREIGN PATENT DOCUMENTS

| 1 262 244 | 2/1972 | (GB) . |
| 1 293 986 | 10/1972 | (GB) . |
| 1 504 025 | 3/1978 | (GB) . |

* cited by examiner

Primary Examiner—David Mis
(74) Attorney, Agent, or Firm—Michael J. Striker

(57) ABSTRACT

The arrangement for producing electrical oscillations in a Giga hertz region has a Gunn element, a housing in which the Gunn element is accommodated and which has an electrically conductive housing cover, the Gunn element being in electrical contact with the electrically conductive housing cover, and an elastic, electrical contact element clamped between a contact surface of the Gunn element and the housing cover.

6 Claims, 1 Drawing Sheet

ARRANGEMENT FOR PRODUCING ELECTRICAL OSCILLATIONS

BACKGROUND OF THE INVENTION

The present invention generally relates to arrangements.

More particularly, it relates to an arrangement for producing electronic oscillations in a Giga hertz region in high frequency circuits (f>50 GHz). Gunn elements are used for generation of oscillations. They are arranged in a housing. The electrical contact between the Gunn element at the inner side of the housing cover must be designed flexibly, since because of the heat produced in the Gunn element, relatives movements between the Gunn elements and the housing occur. Conventionally, the contact between the Gunn element and the housing cover is produced by a so-called bonded Maltese cross. This type of the electrical connection is however difficult to reproducibly manufacture and in a long-term service is not always reliable. It should be noted that due to the small housing dimensions and Gunn element dimensions, a reliable contacting is very difficult.

SUMMARY OF THE INVENTION

Accordingly, it is an object of the present invention to provide an arrangement of the above mentioned general type, which avoids the disadvantages of the prior art.

In keeping with these objects and with others which should become apparent hereinafter, one feature of present invention resides, briefly stated in an arrangement for producing electrical oscillations in Giga hertz region, in which between a contact surface of the Gunn element and the housing cover, an elastic, electrical contact element is clamped.

When the arrangement is designed in accordance with the present invention it has the following advantages. It can be produced with small housing and Gunn-element dimensions, in particular in a Giga hertz region above 50 GHz in an easily reproducible process. In a long-term operation it operates reliably to compensate the relative movements between the Gunn elements and the housing cover.

The novel features which are considered as characteristic for the present invention are set forth in particular in the appended claims. The invention itself, however, both as to its construction and its method of operation, together with additional objects and advantages thereof, will be best understood from the following description of specific embodiments when read in connection with the accompanying drawings.

DESCRIPTION OF PREFERRED EMBODIMENTS

Figure 1:
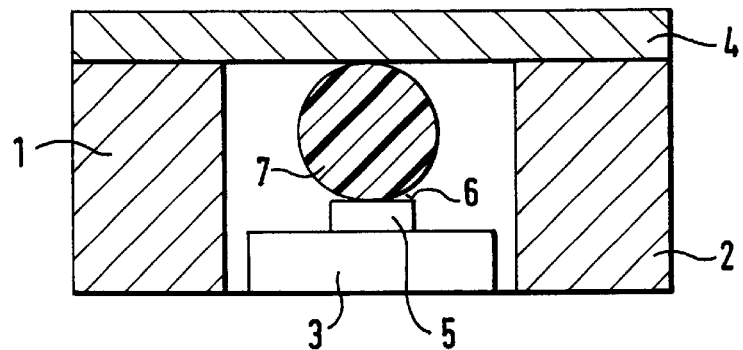
FIG. 1 is a view showing an arrangement in accordance with the present invention with a metalized synthetic plastic ball as an electric contact element.

An arrangement in accordance with the present invention has a housing. Only two side walls 1 and 2, a substrate 3 and a housing cover 4 are schematically shown as components of the housing. A Gunn element 5 is mounted on the substrate 3. It has a contact surface 6.

In accordance with the present invention, an elastic, electrical contact element is arranged between the contact surface 6 of the Gunn element 5 and the housing cover 4.

In accordance with one embodiment shown in FIG. 1, a metallic, elastic synthetic plastic ball 7 is clamped between the housing cover 4 and the contact surface 6. It can yield in a vertical direction when relative movements of the housing cover 4 relative to the Gunn element 5 are required.

Figure 2:
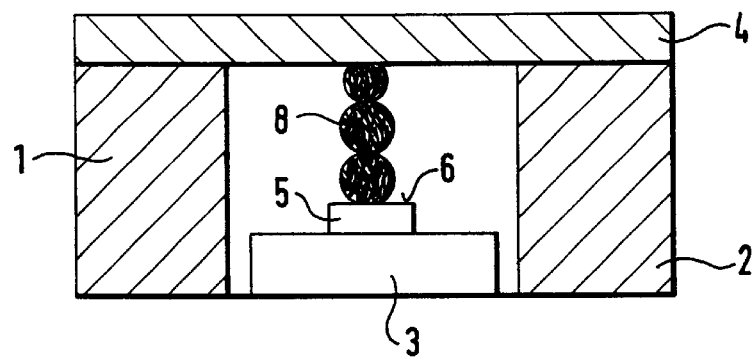
FIG. 2 is a view showing an arrangement in accordance with the present invention with gold ball bonds (bumps) which are bonded with one another, as an electrical contact element.

FIG. 2 shows the arrangement in accordance with another embodiment in which the elastic electrical, contact element is formed in a different way. Here the contact element is formed by three ball bonds (bumps) 8 which are composed of gold and are bonded on one another.

Figure 3:
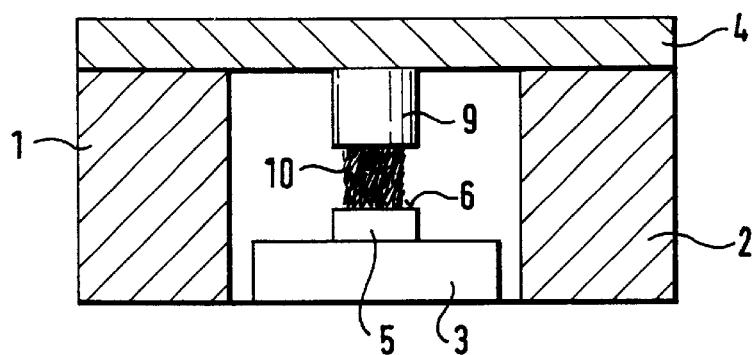
FIG. 3 is a view showing an arrangement in accordance with the present invention with a flexible fabric or chinch contact, as an electrical contact element.

FIG. 3 shows the electrical, elastic contact element in accordance with still another further embodiment. Here, between the housing cover 4 and the contact surface 6, a contact element is provided which is composed of a flexible fabric contact. A skein 10 of an electrically conductive band or thread is arranged in an electrically conductive sleeve 9, which is electrically conductively glued on the housing cover 4.

Figure 4:
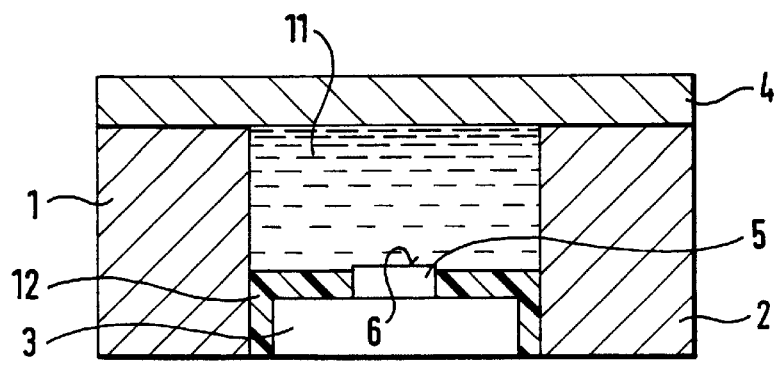
FIG. 4 is a view showing an arrangement in accordance with the present invention, with a liquid mercury contact, as an electrical contact element.

FIG. 4 finally shows the elastic, electrical contact element in accordance with still another embodiment. Here a mercury-filler 11 is used as a flexible contact element. It fills a hollow space between the housing cover 4 on the one hand and the contact surface 6 of the Gunn element 5 on the other hand. The contact surface 6 is surrounded by the insulating material 12, which insulatingly covers the remaining Gunn element 5 inside the hollow space.

It will be understood that each of the elements described above, or two or more together, may also find a useful application in other types of constructions differing from the types described above.

While the invention has been illustrated and described as embodied in arrangement, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. An arrangement for producing electrical oscillations in a Giga hertz region, comprising a Gunn element; a housing in which said Gunn element is accommodated and which has an electrically conductive housing cover, said Gunn element being in electrical contact with said electrically conductive housing cover; and an elastic, electrical contact element clamped between a contact surface of said Gunn element and said housing cover, said contact element being composed of a synthetic plastic ball which is metalized at least on its outer surface.

2. An arrangement for producing electrical oscillations in a Giga hertz region, comprising a Gunn element; a housing in which said Gunn element is accommodated and which has an electrically conductive housing cover, said Gunn element being in electrical contact with said electrically conductive housing cover; and an elastic, electrical contact element clamped between a contact surface of said Gunn element and said housing cover, said contact being composed of a plurality of ball bonds which are composed of gold and bonded over one another.

3. An arrangement for producing electrical oscillations in a Giga hertz region, comprising a Gunn element; a housing in which said Gunn element is accommodated and which has an electrically conductive housing cover, said Gunn element being in electrical contact with said electrically conductive housing cover; and an elastic, electrical contact element clamped between a contact surface of said Gunn element and said housing cover, said contact element being composed of a flexible contact with a skein of an electrically conductive material arranged in an electrically conductive sleeve, said flexible contact being a fabric contact.

4. An arrangement for producing electrical oscillations in a Giga hertz region, comprising a Gunn element; a housing in which said Gunn element is accommodated and which has an electrically conductive housing cover, said Gunn element being in electrical contact with said electrically conductive housing cover; and an elastic, electrical contact element clamped between a contact surface of said Gunn element and said housing cover, said contact element being composed of a flexible contact with a skein of an electrically conductive material arranged in an electrically conductive sleeve, said electrically conductive material being a band.

5. An arrangement for producing electrical oscillations in a Giga hertz region, comprising a Gunn element; a housing in which said Gunn element is accommodated and which has an electrically conductive housing cover, said Gunn element being in electrical contact with said electrically conductive housing cover; and an elastic, electrical contact element clamped between a contact surface of said Gunn element and said housing cover, said contact element being composed of a flexible contact with a skein of an electrically conductive material arranged in an electrically conductive sleeve, said electrically conductive material being threads.

6. An arrangement for producing electrical oscillations in a Giga hertz region, comprising a Gunn element; a housing in which said Gunn element is accommodated and which has an electrically conducive housing cover, said Gunn element being in electrical contact with said electrically conductive housing cover; and an electrical contact element clamped between a contact surface of said Gunn element and said housing cover, said contact element being composed of mercury which fills a hollow space between said housing cover and said contact surface of said Gunn element, which is surrounded by insulation material, while a remaining surface of said Gunn element is insulatingly covered inside said hollow space.

\* \* \* \* \*